United States Patent [19]

Rix et al.

[11] E Re. 28,485

[45] Reissued July 15, 1975

[54] METHOD OF PRODUCING COATINGS ON HARD METAL BODIES

[75] Inventors: Walter Rix; Grete Dix, both of Essen, Germany

[73] Assignee: Fried. Krupp Gesellschaft mit beschrankter Haftung, Essen, Germany

[22] Filed: Jan. 24, 1973

[21] Appl. No.: 326,276

Related U.S. Patent Documents

Reissue of:

[64] Patent No.: 3,558,445
Issued: Jan. 26, 1971
Appl. No.: 641,474
Filed: May 26, 1967

[52] U.S. Cl. ..... 29/198; 117/118; 204/37 R; 204/38 R

[51] Int. Cl. ..... C23f 7/00; C23f 17/00; C23b 5/52

[58] Field of Search ..... 204/37, 38, 37 R, 38 R; 29/198; 117/118

[56] References Cited

UNITED STATES PATENTS

| | | | |
|---|---|---|---|
| 898,979 | 9/1908 | Kuzel | 29/504 |
| 2,456,761 | 12/1948 | Williams | 29/504 |
| 2,465,329 | 3/1949 | Murray | 204/37 R |
| 2,570,248 | 10/1951 | Kelley | 29/473.1 |
| 2,685,543 | 8/1954 | Sindeband | 148/6 |
| 3,001,893 | 9/1961 | Kreuchen et al. | 117/217 |
| 3,171,192 | 3/1965 | Ortner et al. | 75/203 |
| 3,272,963 | 9/1966 | Wasserman et al. | 117/205 X |
| 3,334,975 | 8/1967 | Quass et al. | 29/504 |
| 3,393,084 | 7/1968 | Hartwig | 117/118 X |
| 3,398,256 | 8/1968 | Foley | 29/504 |

FOREIGN PATENTS OR APPLICATIONS

| | | | |
|---|---|---|---|
| 716,034 | 9/1954 | United Kingdom | 75/203 |
| 722,916 | 2/1955 | United Kingdom | 117/118 |
| 766,059 | 1/1957 | United Kingdom | 75/203 |

*Primary Examiner*—F. C. Edmundson
*Attorney, Agent, or Firm*—Spencer & Kaye

[57] ABSTRACT

A [ solid solution ] layer [ of ] *comprising* one or more *of the carbides* of the metals titanium, vanadium, tantalum, or columbium [or their carbides] is formed on the surface of a hard metal body, such as tungsten carbide, by heating the hard metal body in contact with the coating metal, or an alloy, or a readily decomposable compound thereof, at a temperature above about 900°C., or by electrolytic deposition, followed by heating.

10 Claims, No Drawings

METHOD OF PRODUCING COATINGS ON HARD METAL BODIES

Matter enclosed in heavy brackets [ ] appears in the original patent but forms no part of this reissue specification; matter printed in italics indicates the additions made by reissue.

BACKGROUND OF THE INVENTION

It is well known that titanium carbide at elevated temperatures readily and rapidly incorporates large amounts of tungsten or tungsten carbide into its lattice, whereas tungsten carbide does not correspondingly absorb titanium or titanium carbide, or only in very small amounts. Therefore, in a mixture of titanium carbide and tungsten, the tungsten is taken up by the titanium carbide to a considerable percentage as the temperature increases.

It is further known that in a mixture of titanium, tungsten and carbon, [ solid solution is ] *mixed crystals are* formed with the titanium carbide lattice at elevated temperature. Only when the amount of tungsten exceeds the solubility limits for tungsten in titanium carbide, is tungsten carbide formed. These circumstances apply correspondingly to the metals vanadium, tantalum, and columbium, as well as to their carbides.

SUMMARY OF THE INVENTION

In accordance with the present invention, there is provided a process for the preparation, upon the surface of a hard metal (cemented carbide) body containing tungsten carbide of a [ solid solution ] layer [ of ] *comprising* titanium carbide, vanadium carbide, tantalum carbide and/or columbium carbide [ with tungsten carbide ]. This layer exhibits good adhesion to and coalescence with the hard metal body surface.

The present invention comprises forming said [ solid solution ] layer by the reaction of any of the metals titanium, vanadium, tantalum, or columbium, or their alloys or readily decomposable compounds, individually or in combination, with the tungsten carbide of a hard metal body, on the surface of the hard metal body, at elevated temperature. The invention is based upon the principle that in a mixture of tungsten carbide with one or more of the aforementioned metals, or their alloys, or readily decomposable compounds, such as, for example, titanium hydride, or titanium tetrachloride, the tungsten carbide does not take up any titanium, but rather, the tungsten carbide is decomposed, and titanium carbide is formed [ , and the latter absorbs the liberated tungsten into its lattice ].

DESCRIPTION OF THE PREFERRED EMBODIMENTS

In accordance with one embodiment of the invention, the new method can be advantageously carried out in such manner that the hard metal body is embedded in titanium hydride powder, heated under cover of a protective gas to a temperature above about 900°C. and held at this temperature for the desired period of time.

In accordance with another embodiment of the invention, the hard metal body is heated in vacuum with titanium vapor and finally maintained for the desired time at a temperature above about 900°C.

In accordance with another embodiment, the hard metal body is exposed to the vapor of a volatile, readily decomposable titanium compound at elevated temperature; advantageously there can be employed for this purpose titanium tetrachloride vapor at a temperature above about 900°C. The higher the temperature of the treatment, the more rapid is the formation of the desired [ solid solution ] layer.

In accordance with still another embodiment of the invention, the hard metal body is coated with a layer of titanium electrolytically, and then maintained in a vacuum or under a layer of protective gas for the desired period of time at a temperature above about 900°C.

In place of titanium or its compounds or alloys, there can also be employed, correspondingly, the decomposable compounds or alloys of the metals vanadium, tantalum, and columbium.

Examples of suitable alloys of titanium and of the other metals include: 30% Ti, 70% V; 10% Ti, 90% Cb; 80% Ti, 20% Ta; 50% V, 50% Cb; 20% V, 80% Ta; 40% Cb, 60% Ta; 30% Ti, 30% V, 40% Cb; 10% Ti, 30% Cb, 60% Ta; 70% V, 15% Cb, 15% Ta; 25% Ti, 25% V, 25% Cb, 25% Ta.

Examples of suitable decomposable compounds of titanium, and of the other metals include: $TiCl_4$; $TiBr_4$; $TiI_4$; $VI_2$; $VCl_4$; $CoCl_5$; $TaCl_5$; $TaBr_5$.

The upper limit of temperature of heating employed may vary within a wide range, but will generally not exceed about 1800°C.

Examples of protective or inert gases which may be employed in performing the process of the invention include: Hydrogen, helium, argon, neon, krypton, and mixtures thereof.

Typical compositions of the hard metal body include: 98% WC, 2% Co; 70% WC, 30% Co; 60% TiC, 35% WC, 5% Co; 5% TiC, 85% WC, 10% Co; 5% TaC, 85% WC, 10% Co.

The proportions of the coating metals or their compounds or alloys to those of the hard metal body may vary widely, but in general will range from about 0.01 to about 2 parts per 100 parts of hard metal body, by weight.

Where a powder is used for embedding purposes the average particle size is about 10$\mu$m.

Where a vacuum is used, the range will be about $10^{-5}$ mm. Hg. to the highest vacuum obtainable.

EXAMPLE I

In a vacuum of $10^{-5}$ mm. Hg., titanium metal is heated to a temperature of 1260°C., and by this means a titanium layer is vaporized upon a hard metal body consisting of 90% WC and 10% Co held at a temperature of 30°C. The hard metal body coated with this titanium layer is then heated, under argon, to a temperature of 1000°C. and held at this temperature for a period of 15 minutes.

EXAMPLE II

A hard metal body consisting of 5% TaC, 85% WC and 10% Co is embedded in fine-grained titanium hydride powder having an average particle size of 10 $\mu$m, is heated, under hydrogen, to a temperature of 1000°C. and held at this temperature for a period of 15 minutes.

EXAMPLE III

A hard metal body consisting of 70% WC and 30% Co is embedded in a fine-grained powder of a 20% vanadium, 80% tantalum alloy having an average particle size of 10 μm, and held, under helium, at a temperature of 1200°C. for a period of half an hour.

EXAMPLE IV

A hard metal body consisting of 20% TiC, 70% WC and 10% Co is exposed for a period of half an hour to a hydrogen flow carrying vaporized titanium tetrachloride, at a temperature of 1050°C. The grain size of the coating is 1 μm to 5 μm.

EXAMPLE V

In a process as described by M. E. Sibert and M. A. Steinberg in Journal of Electrochemical Society, vol. 102 (1955), p. 641 to 647 a hard metal body consisting of 98% WC and 2% Co is electrolytically coated with a titanium layer having a thickness of about 5 μm, and is then held, under hydrogen, at a temperature of 1100°C. for a period of half an hour.

It will be understood that the above description of the present invention is susceptible to various modifications, changes and adaptations, and the same are intended to be comprehended within the meaning and range of equivalents of the appended claims.

We claim:

1. A process for forming a [ solid solution ] layer on a surface of a hard metal body containing tungsten carbide, the layer comprising at least one member selected from the group consisting of titanium carbide, vanadium carbide, tantalum carbide and columbium carbide, comprising applying to the surface of the hard metal body a coating of (a) at least one member selected from the group consisting of titanium, vanadium, tantalum, and columbium, (b) alloy[s] of (a) or (c) readily decomposable compound[s] of (a) and subjecting said surface of the hard metal body to an elevated temperature above about 900°C. for a period sufficient for forming the [ solid solution ] layer thereon.

2. The process of claim 1 in which the surface is subjected to the elevated temperature under vacuum.

3. The process of claim 1 in which the surface is subjected to the elevated temperature under a protective gas cover.

4. The process of claim 1 in which the coating is applied to the hard metal body surface by vapor coating.

5. The process of claim 1 in which the coating is applied in vapor form at elevated temperature.

6. The process of claim 1 in which the coating is applied electrolytically, followed by heating at elevated temperature.

7. The process of claim 6 in which said heating takes place in a vacuum.

8. The process of claim 6 in which said heating takes place under a protective gas.

9. A process according to claim 1 wherein the [ solid solution ] layer comprises titanium carbide.

10. A hard metal body containing tungsten carbide and having a surface coated with a [ solid solution ] layer comprising at least one member selected from the group consisting of titanium carbide, vanadium carbide, tantalum carbide and columbium carbide.

* * * * *

UNITED STATES PATENT AND TRADEMARK OFFICE

CERTIFICATE OF CORRECTION

PATENT NO. : Re 28,485

DATED : July 15th, 1975

INVENTOR(S) : Walter Rix et al

It is certified that error appears in the above-identified patent and that said Letters Patent are hereby corrected as shown below:

In the heading of the patent, insert --[30] Foreign Application Priority Data June 2, 1966 Germany 1521166--.

Signed and Sealed this

*ninth* Day of *March 1976*

[SEAL]

*Attest:*

RUTH C. MASON
*Attesting Officer*

C. MARSHALL DANN
*Commissioner of Patents and Trademarks*

UNITED STATES PATENT AND TRADEMARK OFFICE

CERTIFICATE OF CORRECTION

PATENT NO. : Re 28,485

DATED : July 15th, 1975

INVENTOR(S) : Walter Rix et al

It is certified that error appears in the above-identified patent and that said Letters Patent are hereby corrected as shown below:

Column 2, line 26, change "$CoCl_5$" to --$CbCl_5$--.

Signed and Sealed this

*first* Day of *June 1976*

[SEAL]

*Attest:*

RUTH C. MASON
*Attesting Officer*

C. MARSHALL DANN
*Commissioner of Patents and Trademarks*